United States Patent [19]
McCollum et al.

[11] Patent Number: 5,552,627
[45] Date of Patent: Sep. 3, 1996

[54] ELECTRICALLY PROGRAMMABLE ANTIFUSE INCORPORATING DIELECTRIC AND AMORPHOUS SILICON INTERLAYERS

[75] Inventors: John L. McCollum, Saratoga; Abdelshafy A. Eltoukhy; Abdul R. Forouhi, both of San Jose, Calif.

[73] Assignee: Actel Corporation, Sunnyvale, Calif.

[21] Appl. No.: 231,634

[22] Filed: Apr. 22, 1994

Related U.S. Application Data

[63] Continuation-in-part of Ser. No. 4,912, Jan. 19, 1993, Pat. No. 5,411,917, which is a continuation of Ser. No. 604,779, Oct. 26, 1990, Pat. No. 5,181,096, which is a continuation-in-part of Ser. No. 508,306, Apr. 12, 1990, Pat. No. 5,070,384.

[51] Int. Cl.$^6$ ...................................................... H01L 29/00
[52] U.S. Cl. ............................ 257/530; 257/50; 257/753; 257/764
[58] Field of Search ........................... 257/530, 50, 753, 257/764

[56] References Cited

U.S. PATENT DOCUMENTS

| | | | |
|---|---|---|---|
| 4,217,374 | 8/1980 | Ovshinsky et al. | 257/52 |
| 4,226,898 | 10/1980 | Ovshinsky et al. | 257/52 |
| 4,424,578 | 1/1984 | Miyamoto | 257/530 |
| 4,499,557 | 2/1985 | Holmberg et al. | 257/530 |
| 4,569,121 | 2/1986 | Lim et al. | 29/574 |
| 4,800,176 | 1/1989 | Kakumu et al. | 437/193 |
| 4,882,611 | 11/1989 | Blech et al. | 357/51 |
| 4,914,055 | 4/1990 | Gordon et al. | 437/192 |
| 4,949,084 | 8/1990 | Schwartz et al. | 257/530 |
| 5,093,711 | 3/1992 | Hirakawa | 357/71 |
| 5,100,827 | 3/1992 | Lytle | 437/52 |
| 5,110,754 | 5/1992 | Lowrey et al. | 437/52 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,181,096 | 1/1993 | Forouhi | 257/530 |
| 5,196,724 | 3/1993 | Gordon et al. | 257/530 |
| 5,233,217 | 8/1993 | Dixit et al. | 257/530 |
| 5,242,851 | 9/1993 | Choi | 437/49 |
| 5,270,251 | 12/1993 | Cohen | 437/173 |
| 5,272,101 | 12/1993 | Forouhi et al. | 437/50 |
| 5,290,734 | 3/1994 | Boardman et al. | 437/195 |
| 5,300,456 | 4/1994 | Tigelaar et al. | 437/195 |

FOREIGN PATENT DOCUMENTS

| | | |
|---|---|---|
| 0224418 | 6/1987 | European Pat. Off. .. |
| 0323078 | 12/1988 | European Pat. Off. .. |
| 0162529 | 3/1989 | European Pat. Off. .. |
| 0414361 | 2/1991 | European Pat. Off. .. |
| 0416903 | 3/1991 | European Pat. Off. .. |
| 0452091 | 9/1991 | European Pat. Off. .. |

(List continued on next page.)

OTHER PUBLICATIONS

G. H. Chapman et al., "A Laser Linking Process for Restructurable VLSI", CLEO '82 (Apr. 1982) 5 pages.

T. C. Penn "New Methods for Processing Silicon Slices", Science, vol. 208 (May 1980) pp. 923–6.

Burns, G. P. "Titanium dioxide dielectric films formed by rapid thermal oxidation" 1989, Journal of Applied Sciences, pp. 2095–2097.

Pauleau, Y. "Interconnect Materials for VLSI Circuits", Apr. 1987, Solid State Technology, pp. 155–162.

*Primary Examiner*—J. Carroll
*Attorney, Agent, or Firm*—D'Alessandro & Ritchie

[57] ABSTRACT

An antifuse may be fabricated as a part of an integrated circuit in a layer located above and insulated from the semiconductor substrate. The antifuse includes a lower first metal electrode, a first antifuse dielectric layer, preferably silicon nitride, disposed on the lower first electrode and an antifuse layer, preferably amorphous silicon, disposed on the first dielectric layer. An inter-layer dielectric layer is disposed on the antifuse layer and includes an antifuse via formed completely therethrough. A second antifuse dielectric layer, preferably silicon nitride, is disposed over the amorphous silicon layer in the antifuse via, and an upper second metal electrode is disposed over the second dielectric layer in the antifuse via.

18 Claims, 5 Drawing Sheets

FOREIGN PATENT DOCUMENTS

| | | |
|---|---|---|
| 0455414 | 11/1991 | European Pat. Off. . |
| 0501120 | 9/1992 | European Pat. Off. . |
| 0539197 | 4/1993 | European Pat. Off. ............... 257/530 |
| 3927033 | 3/1990 | Germany . |
| 3927033 | 3/1990 | Germany . |
| 59-098971 | 5/1984 | Japan . |
| 60-74669 | 4/1985 | Japan . |
| 64-28937 | 2/1989 | Japan . |
| 4235042 | 9/1992 | Japan . |
| 6-85068 | 3/1994 | Japan . |
| 8503599 | 8/1985 | WIPO . |
| 9220109 | 11/1992 | WIPO . |
| 9303499 | 2/1993 | WIPO . |

ELECTRICALLY PROGRAMMABLE ANTIFUSE INCORPORATING DIELECTRIC AND AMORPHOUS SILICON INTERLAYERS

RELATED APPLICATIONS

This application is a continuation-in-part of application Ser. No. 08/004,912, filed Jan. 19, 1993, now U.S. Pat. No. 5,411,917, which is a continuation of application Ser. No. 07/604,779, filed Oct. 26, 1990, now U.S. Pat. No. 5,181,096, which is a continuation-in-part of application Ser. No. 07/508,306, filed Apr. 12, 1990, now U.S. Pat. No. 5,070,384.

BACKGROUND OF THE INVENTION

1. Field of the Invention

This invention relates to integrated electronic circuit technology. More particularly, this invention relates to electrically programmable antifuse elements and to methods for fabricating them.

2. The Prior Art

Integrated electronic circuits are usually fabricated with all internal connections set during the manufacturing process. However, because of high development costs and high manufacturing tooling costs of such circuits, it is advantageous if such circuits can be configured or programmed by the user for a specific application. Such circuits are called programmable circuits and are programmed by either selectively breaking or creating a series of programmable links. Programmable links are electrical interconnects which are broken or created at selected electronic nodes in the circuit by the user after the integrated circuit device has been fabricated and packaged. Such programming is undertaken in order to activate or deactivate, respectively, the selected electronic nodes such that the PROM can be programmed to perform a desired function.

Fusible links have been used extensively in PROM devices and are well known. A PROM device usually consists of an X-Y matrix or lattice of conductors or semiconductors. At each cross-over point of the lattice, a conducting link connects a transistor or other electronic node to the lattice network. The PROM is programmed by providing a high programming current to predesignated fusible links which connect to selected nodes. Links are then blown out to create an open circuit. The combination of blown and unblown fusible links represents a digital bit pattern of ones and zeros signifying data which the user wishes to store in the PROM.

Fusible link PROM systems present certain disadvantages. For example, relatively high programming voltages and high current levels are needed during programming to guarantee the complete blowing out of the fusible links. Since the fusible link is usually conductive, excessive power dissipation may be necessary in order to blow out the link and thus program the device. Also, the shape and size of the fusible links must be very precisely controlled so that the link will function effectively as a conductor if it is not blown out. Conversely, the fusible link must be a completely open circuit if it is blown. Therefore, very critical photolithographic steps and controlled etched techniques are required during the manufacturing of fusible link PROMs. Such precise dimensional tolerances are difficult and expensive to attain. In addition, a large gap must be blown in the fusible link in order to prevent it from later closing by reason of the accumulation of conducting material near the blown gap. Accordingly, fusible link memory cells must be disadvantageously large in order to accommodate the fusible link and an associated selection transistor which develops the high current needed to blow the link. Fusible links therefore take up an excessively large amount of valuable space on a semiconductor chip and have high manufacturing and material costs.

Another type of programmable link, called an antifuse link, has been developed for use in integrated circuit applications in order to overcome the foregoing disadvantages of fusible links. Instead of a programming mechanism for causing an open circuit as is the case with the fusible link, the programming mechanism for an antifuse creates a short circuit or relatively low resistance link. Antifuse links consist typically of two conductor and/or semiconductor elements having some kind of a dielectric or insulating material between them. During programming, the dielectric at selected points between the conductive elements is broken down by a current developed from a predetermined programming voltage applied to the conductive elements of selected links to thereby electrically connect the conducting or semiconducting elements.

Various materials have been suggested for both the conducting elements and the dielectric or insulating layer. Some of these suggested dielectric materials require a relatively high current and voltage during programming and therefore demand complex manufacturing techniques. Such antifuse elements have low reliability during programming because it is difficult to control the reproducability of the conductive state due to the nature of the crystalline microstructures of the dielectric layer.

In addition, the programming process results in a link having a finite resistance on the order of several hundred to several thousand ohms. This characteristic of known antifuse elements renders them relatively unsuitable for use in high speed circuits. Such increased resistance results in high impedance and unacceptably high power consumption when several thousand circuits are switching simultaneously.

Prior art antifuse devices are typically one of two major types depending upon the dielectric or insulating material which comprises the interlayer disposed between the two conductive elements. Dielectric antifuses typically employ silicon dioxide or a multilayer sandwich of silicon dioxide and silicon nitride. Antifuse elements employing a dielectric interlayer are disadvantageous because they require programming voltages on the order of 16 to 20 volts in order to be programmed and still remain reliable at normal operating voltages of 5 volts. In order to program dielectric type antifuses so that they maintain reliable operation at 5 volts, the dielectric thickness must be on the order of 100 angstroms. Such a thin interlayer has the disadvantage of producing a relatively high capacitance. This can severely limit device operating speed because numerous unknown antifuses on a single line act as capacitors linked in parallel. The sum of the individual capacitances of the unprogrammed antifuses therefore may be quite high and may drastically slow down data signals.

Another possible drawback of known dielectric antifuses containing silicon dioxide or a multilayer sandwich of silicon dioxide and silicon nitride is that a high temperature low pressure chemical vapor deposition (LPCVD) process must be used in order to deposit the thin oxide layer, or nitride layer with good uniformity and film controllability. However, the high temperature LPCVD process may have the disadvantage of inducing the formation of hillocks on the first metallic layer. The hillock formations may extend through the 100 angstrom thin oxide and cause multiple short circuits between the first and second metallic layers, so it is advisable to avoid hillocks between metal layers.

The second type of prior art antifuse typically comprises an interlayer of amorphous silicon sandwiched between first and second layers of metal. The antifuses incorporating an amorphous silicon interlayer provide a thickness on the order of twenty times greater for the same programming voltage as compared to the dielectric antifuses with the 100 angstrom or less thin oxide or thin nitride layers. However, amorphous silicon antifuses have the disadvantage of extremely high leakage currents. The high leakage current inherent in the use of amorphous silicon can create a serious problem in terms of the controllability of the programming voltage. High leakage current can also cause severe storage time degradation in MOS devices. Thus, prior art amorphous silicon antifuses have serious programmability problems. In addition, an amorphous silicon antifuse may be prone to crack propagation and continuity failure after long hours of operation.

Planar structures have often been used to minimize step effects in contacts. Therefore, such planar structures have also been proposed as a method of reducing step thinning of the antifuse material layer in amorphous silicon antifuses. Due to process variations, this however means that an uncertain amount of the amorphous silicon is etched when the cell opening is etched. This is not desirable if a sandwich of multiple materials is used to construct the antifuse as the over-etch of the antifuse via will cause an uncertain thickness of the top layer of the sandwich to be removed. The result is unacceptable variations in programming voltage due to process variation, and, in extreme cases, reliability problems.

In order to overcome the foregoing disadvantages of prior art antifuses wherein the interlayer consists exclusively either of a dielectric or an amorphous silicon material, it is an object of the present invention to provide an electrically programmable low impedance antifuse which may be programmed with programming voltages of 18 volts or less in order to maintain reliable low impedance operation at standard MOS device operating voltage of 5 volts.

It is yet a further object of the present invention to provide a antifuse element having a well-controlled programming voltage which will provide an improved degree of uniformity in the formation of the ohmic contact between the conducting elements and will advantageously require a lower programming voltage.

It is another object of the present invention to provide a plurality of electrically programmable antifuse elements with substantially reduced parasitic capacitance for use in a PROM device which will result in faster speed and greatly reduced power consumption when several thousand gates are switching simultaneously.

It is yet another object of the present invention to provide an electrically programmable antifuse element which substantially eliminates leakage currents, crack propagation and continuity failure inherent in a prior art amorphous silicon antifuse elements and thereby greatly improve the memory storage reliability and useful lifetime of a PROM device incorporating a plurality of antifuse elements. Other and further advantages of the present invention will appear hereinafter.

It is another object of the present invention to provide an electrically programmable antifuse element which is characterized by a planar structure that avoids shortcomings of other planar structure antifuses.

It is another object of the present invention to provide an electrically programmable antifuse element which is characterized by a planar structure that is substantially immune to the deleterious effects caused by the formation of the antifuse via in the inter-layer dielectric layer.

BRIEF DESCRIPTION OF THE INVENTION

In order to overcome the above discussed disadvantages of known antifuse elements, an electrically programmable low impedance antifuse element is disclosed, a plurality of which may be integrated on a semiconductor substrate.

An antifuse according to the present invention may be fabricated as a part of an integrated circuit in a layer located above and insulated from the semiconductor substrate. As previously disclosed in prior application Ser. No. 07/604,779, filed Oct. 26, 1990, now U.S. Pat. No. 5,181,096, antifuse includes a lower first electrode, a first dielectric layer disposed over the lower first electrode, a layer of amorphous silicon disposed above the first dielectric layer, a second dielectric layer disposed above the amorphous silicon layer, and an upper second electrode disposed above the second dielectric layer. The layer of silicon nitride is used to prevent chemical interaction between the metal conductor and the amorphous silicon. In addition, when the structure of the present invention is programmed, the current flow is confined to a small hole in the silicon nitride thereby forming a more reliable conducting link or filament.

To avoid the aforementioned drawbacks of a planar structure, the lower layer of silicon nitride and the amorphous silicon layer are formed on the upper surface of the lower electrode. The inter-metal dielectric layer is then formed and an antifuse via (sometimes referred to as a contact hole or via) is defined by a photomask and then formed using an etching process. The second dielectric layer comprising the final layer of the antifuse material, also preferably comprising a generic silicon nitride, is deposited in the via. This layer is preferably thin, i.e., between about 25 to about 300 angstroms. The upper antifuse electrode is then formed over the upper dielectric layer.

Because the upper dielectric layer is formed in the antifuse via after the via is formed, it is not attacked by the etching step which was used to form the via. Also, since the silicon nitride layer is thin, and therefore deposited at a slow rate, the thinning is much less than with thicker films. This thus results in superior antifuse for small geometries. Additionally, the thinning at the corner will actually occur at the point of etch into the silicon and will therefore break at the corner away from the oxide.

According to an alternate embodiment of the present invention, a layer of Ti may be interposed between the layers comprising the antifuse layer and each of the electrodes. The Ti layer acts to enhance the reliability of the antifuse and prevent the phenomenon known as "switching" wherein a previously programmed antifuse reverts back to its unprogrammmed open state after time has elapsed.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The present invention is particularly useful for providing an antifuse structure for connecting together conductors disposed in adjacent metal layers of an integrated circuit. The particular illustrative embodiment of the antifuse element disclosed herein is shown formed between two metal interconnect layers in a multiple-layer metal CMOS process, wherein a portion of the lower metal layer comprises the lower antifuse electrode and a portion of the upper metal layer comprises the upper antifuse electrode. From the teachings herein, those of ordinary skill in the art will recognize that the antifuse of the present invention could be formed between any two adjacent metal layers in a semiconductor or other microcircuit structure. As non-exhaustive examples, the antifuse of the present invention could be formed between the first and second metal interconnect layers of a double-metal integrated structure or between the first and second, second and third, or first and third metal interconnect layers of a triple-metal integrated structure. In addition, the antifuse structure of the present invention may be fabricated with its lower electrode, its upper electrode, or both its lower and upper electrodes formed from polysilicon or polycide.

Figure 1:
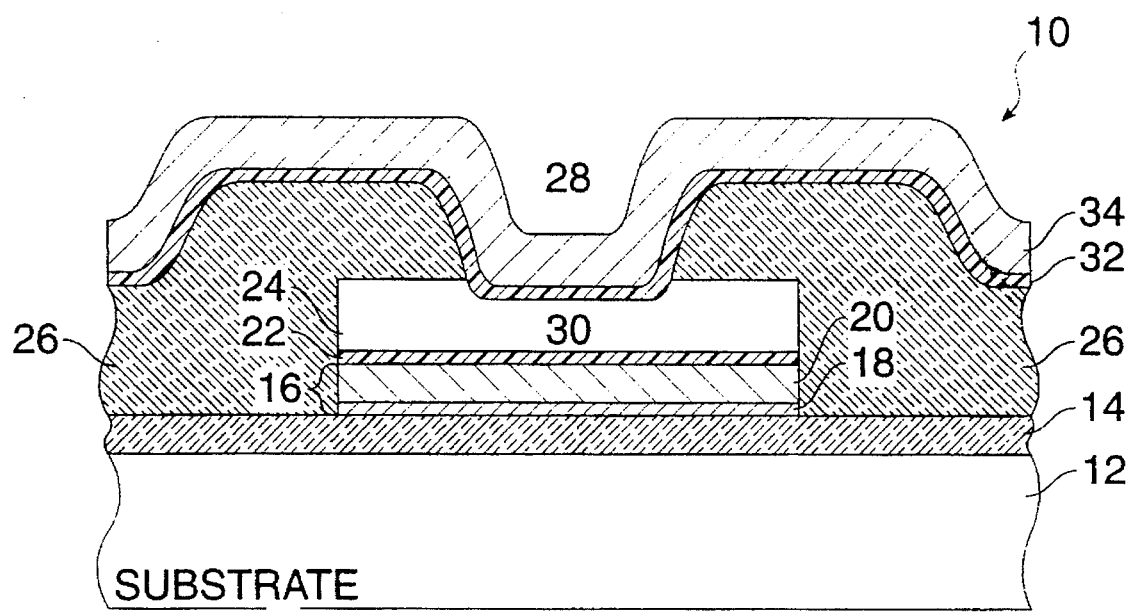
FIG. 1 is a cross-sectional view of the structure of an antifuse element according to a presently preferred embodiment of the invention.

Referring first to FIG. 1, a preferred embodiment of the present invention is an antifuse 10 shown fabricated on a semiconductor substrate 12. Those of ordinary skill in the art will readily recognize that substrate 12 may in fact be a well region of one conductivity type fabricated in a semiconductor substrate of opposite conductivity type as is common in a CMOS process. Such skilled persons will also recognize that substrate 12 could also be formed from a material other than a semiconductor, i.e., an insulating material.

Disposed above substrate 12 is a layer 14, which those of ordinary skill in the art will recognize to comprise all the thin film layers above the substrate necessary for the fabrication of the integrated circuit. As is common in CMOS processes, a BPSG or other passivation layer will be the topmost film in layer 14. Layer 14 may be unnecessary in some instances where substrate 12 is formed from an insulating material.

The first, or lower, electrode 16 of the antifuse 10 of the present invention is disposed on the upper surface of layer 14 and is formed using conventional thin film processing techniques. According to a presently preferred embodiment of the invention, lower electrode 16 may comprise a portion of a metal interconnect layer used in the microcircuit containing the antifuses of the present invention.

Where necessary as described below, lower electrode 16 of the antifuse element 10 may comprise a composite layer including a first adhesion-promoting layer 18 such as Ti, Cr and TiW, having a thickness of about 100 angstroms, covered by a metal layer 20. Those of ordinary skill in the art will recognize that adhesion-promoting layer 18 may not be necessary, depending on the particular materials used for metal layer 20, for example, if metal layer 20 is formed from TiN, an adhesion-promating layer 18 would not be required.

Metal layer 20 may comprise metals such as aluminum, a refractory metal such as tungsten, molybdenum, platinum, titanium, titanium nitride, tantalum or silicides of those metals. Titanium and titanium nitride are presently preferred. Alternatively, and as previously noted, however, lower electrode 16 of the antifuse 10 of the present invention may be formed from polysilicon, preferably doped with arsenic.

Metal layer 20 may have a thickness in the range of between about 1,000 angstroms and 10,000 angstroms, preferably from about 4,000 angstroms to 6,000 angstroms. One purpose of using an arsenic-polysilicon layer as lower electrode 16 is to reduce the resistance of the antifuse if desired, as taught in U.S. Pat. No. 4,823,201 to Mohsen, et al. and U.S. Pat. No. 4,899,205, both assigned to the same assignee as the present invention, and both of which are expressly incorporated herein by reference. The arsenic dopant concentration of such a polysilicon antifuse electrode should be somewhere on the order of $10^{20}$ atoms/cm$^3$.

If the first and second antifuse electrodes are made of materials such as tungsten, an adhesion promoting layer 18 may be employed. As is well known by those of ordinary skill in the art, tungsten does not adhere well to oxides such as $SiO_2$, PSG, and BPSG, from which layer 14 may be formed. Thus, adhesion promoting layer 18, formed from materials such as Ti, TiW or Cr, about 100 angstroms thick, should be deposited between the tungsten and any c f such oxide layers as is well known in the art. As presently preferred, the lower electrode 16 comprises a layer of Ti or TiN.

A first dielectric layer 22 is disposed over the surface of lower electrode 16. In a presently preferred embodiment, first dielectric layer 22 is a layer of a generic silicon nitride $Si_xN_y$:H, produced by a CVD method such as PECVD or LPCVD. In a presently preferred embodiment, first dielectric layer 22 may have a thickness in the range of from between about 50 to 300 angstroms.

Those of ordinary skill in the art will recognize that other dielectric materials, such as $Si_3N_4$, $SiO_2$, silicon oxynitride and suboxide of silicon ($SiO_x$) and other dielectric materials compatible with semiconductor processing techniques may be used for first dielectric layer 22, and depending on the material chosen for conductive layer 20, an adhesion promoting layer may be utilized if necessary.

An antifuse layer 24 of doped or undoped silicon film, preferably produced by known CVD or sputtering techniques, is otisposed over the first dielectric layer 22. In a presently preferred embodiment, this antifuse layer may be formed of hydrogenated amorphous silicon (a-Si:H), amorphous silicon (a-Si), or polycrystalline silicon, and may have a thickness in the range of about between 1,000 to 5,000 angstroms. If desired, antifuse layer 24 may be lightly doped with boron, phosphorus or arsenic to a level, for example, of about $1\times10^{14}$ atoms/cm$^3$ for the purpose of stabilizing the microstructure of the amorphous silicon.

As shown in FIG. 1, the composite lower electrode 16, first dielectric layer 22 and antifuse layer 24 are preferably defined in a single etching step using conventional semiconductor processing techniques to provide both metal or other interconnects and lower electrodes for a plurality of antifuses according to the present invention.

An inter-layer dielectric layer 26 is disposed over the composite structure of layers 16, 22, and 24, and an antifuse via 28 is formed therein. Those of ordinary skill in the art will note that antifuse layer 24 is somewhat thinned in the region 30 of the antifuse via 28 (shown at reference numeral 30) due to the necessary over-etch which occurs during the formation of the antifuse via 28.

A second dielectric layer 32, similar to first dielectric layer 22, is disposed in antifuse via 28 on the surface of antifuse layer 24. Second dielectric layer 32 may be formed using a CVD method such as PECVD or LPCVD. The materials used for second dielectric layer 32 may be any of the materials from which first dielectric layer 22 is formed. First and second dielectric layers 22 and 32 need not be made of the same material.

Finally, second, or upper, electrode 34 is disposed in antifuse via 28 over second dielectric layer 32. Upper electrode 34 may be formed using conventional thin film deposition techniques. Like lower electrode 16, upper electrode 34 may be a composite of an adhesion-promoting layer (if necessary as described above), such as Ti and TiW, having a thickness of about 100 angstroms, and a metal layer as used for the first electrode, having a thickness in the range of from about 1,000 angstroms to 10,000 angstroms. As presently preferred, the upper electrode 34 also comprises a layer of Ti or TiN. Alternately, as noted, a polysilicon upper electrode may be utilized.

The employment of the composite interlayer comprising first and second dielectric layers 22 and 32 and antifuse layer 24 as disclosed herein has the advantage of substantially eliminating parasitic capacitances and leakage currents which are so common in prior art antifuse elements. The parasitic capacitance may be substantially eliminated because of the increased spacing between the lower and upper electrodes 16 and 34 afforded by the composite dielectric and amorphous silicon interlayer.

It will be appreciated that antifuse layer 24 in combination with adjacent first and second dielectric layers 22 and 32 also has the advantage of substantially eliminating defect densities such as crack propagation, continuity failure, and other structural defects which cause leakage currents since such defects would have to appear simultaneously at the same point in both the first and second dielectric layers 22 and 32 and antifuse layer 24, a highly unlikely event. Thus, the novel combination of first and second dielectric layers 22 and 32 and antifuse layer 24 interposed between them provides greatly enhanced antifuse reliability than is possible with most antifuse structures.

The antifuse structure of the present invention presents several advantages over conventional planar antifuse structures in which layers 22, 24, and 32 are formed and defined prior to formation of antifuse via 28. First, the relatively thin second dielectric layer 32 is not subject to the over-etch in the step which forms the antifuse via 28 since it does not yet exist at the time antifuse via 28 is formed. Second, since this layer is thin, i.e., 100 angstroms, it may therefore be deposited at a slower rate, resulting in less thinning at the corners in the bottom of the antifuse via 28.

Finally, because the over-etch of antifuse via 28 has removed some of the antifuse layer 24, the thinning of the second dielectric layer 32 at the corners of the bottom of antifuse via 28 will actually occur at the point of etch in the antifuse layer 24 and not at the boundary of second dielectric layer 32 and the inter-layer dielectric layer 26. Because inter-layer dielectric layer 26 is typically an oxide, the fact that the thinned corners of second dielectric layer 32 (the probable site for programming to take place because of the thinned region) are adjacent to silicon rather than oxide, reduces the risk of incorporating oxide material into the antifuse conductive link or filament which will form the connection between the lower and upper electrodes 16 amd 34. This reduced risk of incorporation of oxide into the filament material of the programmed antifuse increases the reliability of the programmed structure.

In addition, the antifuse breakdown voltage of the antifuse of the present invention may be better controlled because the presence of the nitride layer is a barrier to the transport of the material from the metal electrode into the amorphous silicon antifuse layer.

Finally, the value of the programming voltage as a function of polarity can be adjusted by changing the thickness of the bottom and top nitride layers 22 and 32. For example, by thinning the top nitride layer 30 to 50 angstroms and thickening the bottom nitride layer 20 to 200 angstroms, the programming voltage will be lowered if the positive potential is applied to the lower electrode 16, relative to the programming voltage where the positive potential is applied to the upper electrode 34.

Referring now to FIGS. 2a–2e, cross sectional views depicting the formation of the antifuse structure of FIG. 1 are presented, showing the structure resulting after selected ones of the processing steps used to fabricate the antifuse 10 of the present invention.

Figure 2A:
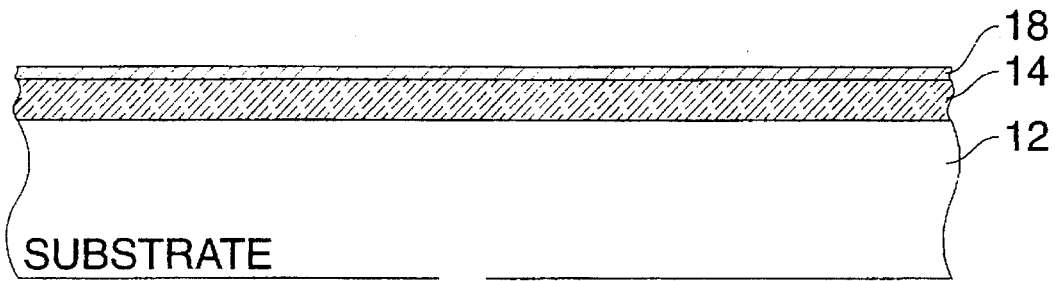
FIGS. 2a–2e are cross-sectional views of the antifuse element of FIG. 1, shown after completion of selected processing steps used to form the antifuse structure.

Referring now to FIG. 2a, substrate 12 covered by layer 14 is shown after formation of adhesion promoting layer 18. For example, an adhesion promoting layer 18 formed from materials such as Ti, TiW, TiN, or Cr, about 100 angstroms thick, should be deposited before a tungsten lower electrode is formed. Those of ordinary skill in the art will readily perceive the composition of such a layer to promote adhesion of other materials from which the lower electrode will be formed. FIG. 2a shows the structure resulting after the formation of the adhesion promoting layer 18.

Figure 2B:
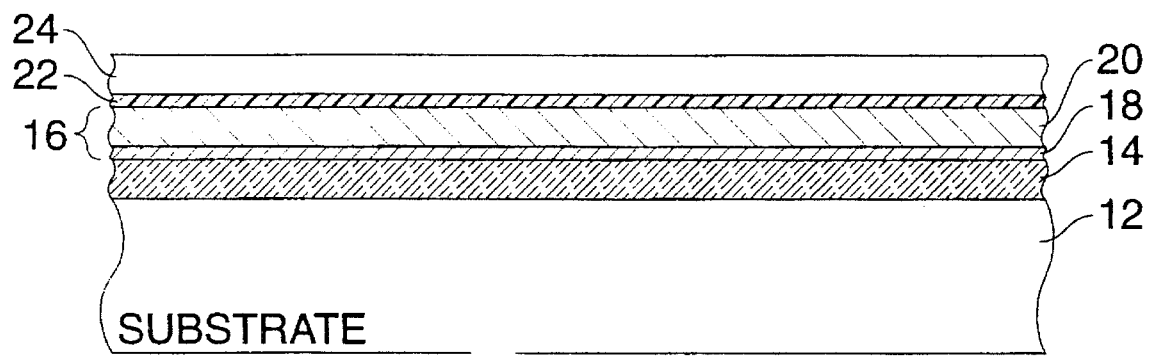

Referring now to FIG. 2b, the metal layer 20, which, together with adhesion-promoting layer 18 if needed, comprises lower electrode 16, has been formed to a thickness of between about 1,000 and about 10,000 angstroms using conventional metal processing technology.

First dielectric layer 22, preferably comprising a layer of a generic silicon nitride $Si_xN_y$:H, has been formed to a thickness of between about 50 and about 300 angstroms using a CVD method such as PECVD or LPCVD. As will be appreciated by those of ordinary skill in the art, silicon nitride may also be deposited using an $NF_3$ atmosphere in the reactor instead of $NH_4$, resulting in a material which is defined as $Si_xN_y$:F instead of $Si_xN_y$:H. This fluorinated nitride material has a lower leakage than a similar nitride material produced in an ammonia atmosphere.

Antifuse layer 24 of doped or undoped silicon film, preferably formed by known CVD or sputtering techniques, is next formed over the first dielectric layer 22. In a presently preferred embodiment, this antifuse layer 24 may be formed of hydrogenated amorphous silicon (a-Si:H), amorphous silicon (a-Si), fluorinated amorphous silicon (a-Si:F) or polycrystalline silicon, and may have a thickness in the range of from about 300 to about 5,000 angstroms. As previously noted, antifuse layer 24 may be lightly doped with boron, phosphorus or arsenic to a level, for example, of about $1\times10^{14}$ atoms/cm$^3$ for the purpose of stabilizing the microstructure of the amorphous silicon.

Figure 2C:
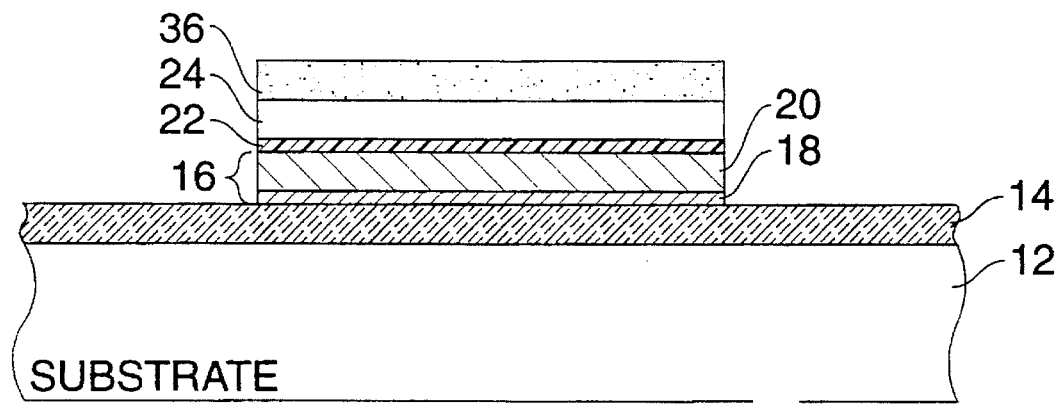

A first photoresist layer 36 is placed over the composite structure of layers 18, 20, 22, and 24 and is exposed and developed using conventional photolithography techniques. The composite structure of layers 18, 20, 22, and 24 is then etched to define the lower portion of the antifuse structure, preferably using a plasma etching technique with first photoresist layer 36 as a mask. FIG. 2c shows the structure resulting from the etching step used to define the composite structure of layers 18, 20, 22, and 24 prior to removal of first photoresist layer 36.

Figure 2D:
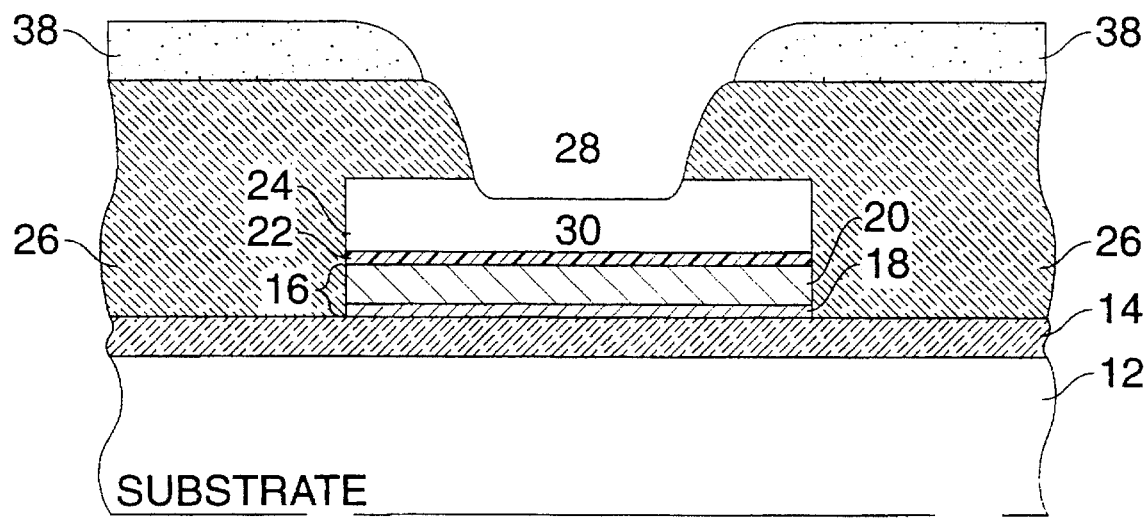

Referring now to FIG. 2d, the first photoresist layer 36 is removed using conventional techniques, and an inter-layer dielectric layer 26 is formed over the composite structure of layers 18, 20, 22, and 24. inter-layer dielectric 26 is typically formed from PECVD silicon dioxide. A second photoresist layer 38 to define the antifuse via is placed over the surface of inter-layer dielectric layer 26 and is exposed and developed using conventional photolithography techniques. The inter-layer dielectric layer 26 is then etched using second photoresist layer 38 as a mask to define antifuse via 28. This etching step may be performed using a plasma etching technique to allow formation of a small geometry antifuse via 28. FIG. 2d shows the structure resulting from the antifuse via 28 etching step prior to removal of second photoresist layer 38. Those of ordinary skill in the art will notice the thinned region 30 of antifuse layer 24 at the bottom of antifuse via 28 as a result of the over-etch to assure complete formation of antifuse via 28. For an amorphous silicon antifuse layer 24 having a thickness of 300 to 1,000 angstroms and an inter-layer dielectric layer 26 having a thickness of 0.2 to 1.5 microns, the amount of thinning of antifuse layer 24 should be about 100 angstroms in a typical etch of a 0.6 micron sized antifuse via 28.

Figure 2E:
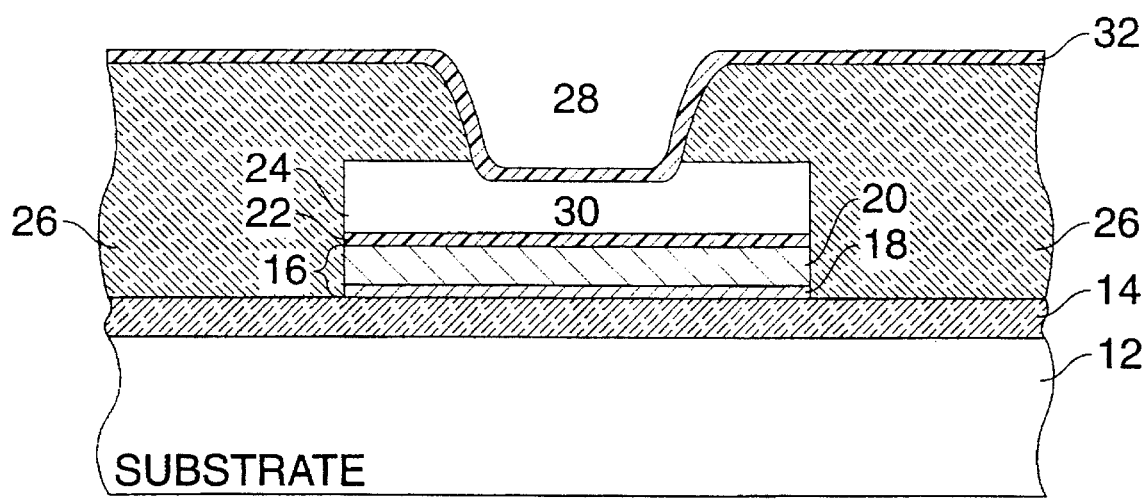

Referring now to FIG. 2e, second photoresist layer 38 is removed and a second dielectric layer 32 is formed. This layer is preferably, but need not be, formed from the same material as first dielectric layer 22 using the same materials processing techniques. From an examination of FIG. 2e, those of ordinary skill in the art will recognize that the "corner" of second antifuse dielectric layer 32 is disposed in the thinned region 30 of antifuse layer 24. This structure is advantageous because experimental evidence has shown that an antifuse having the type of structure wherein an antifuse material layer is disposed in a via is likely to program at the edges or corners of the via where the step coverage of the antifuse material results in a thinned region of material. The corners of the dielectric layer 32 lie adjacent to silicon of the antifuse material layer 24 and not the inter-layer dielectric layer 26. Because of this structure, the antifuse conductive link or filament formed during programming of the antifuse is far less likely to contain silicon dioxide material from the inter-layer dielectric layer 26.

According to the present invention, it is presently preferred to perform the deposition of a-Si:H, a-Si:F, $Si_xN_y$:H and $Si_xN_y$:F at a temperature of about 380° C. although it is believed that the temperature may range from about 200°–450° C. It is also presently preferred that the hydrogen content of the a-Si:H be about 10%, although it is presently believed that ranges from about 5–40% will result in a functional antifuse. In addition, the composition of $Si_xN_y$:H is preferably one in which x=3 and y=4, although silicon rich compositions are believed to be satisfactory the composition of $Si_xN_y$:F is preferably one in which x=3 and y=4, although silicon rich compositions are believed to be satisfactory. The preferred fluorine content of the $Si_xN_y$:F is about 10%, although it is presently believed that ranges from about 2–20% will result in a functional antifuse.

The antifuse 10 of the present invention is programmed by applying a voltage between the lower and upper electrodes 16 and 34. The magnitude of the programming voltage necessary to program the antifuse 10 of the present invention depends on several factors including the thicknesses of layers 22, 24, and 32, the hydrogen content of these layers, as well as Si to N ratios of first and second dielectric layers 22 and 32. For example, an antifuse 10 having 150 angstroms of PECVD silicon nitride for first and second dielectric layers 22 and 32 and 2,000 angstroms of amorphous silicon for antifuse layer 24, all deposited at 380° C., will need about 12 volts to program it.

Figure 3:
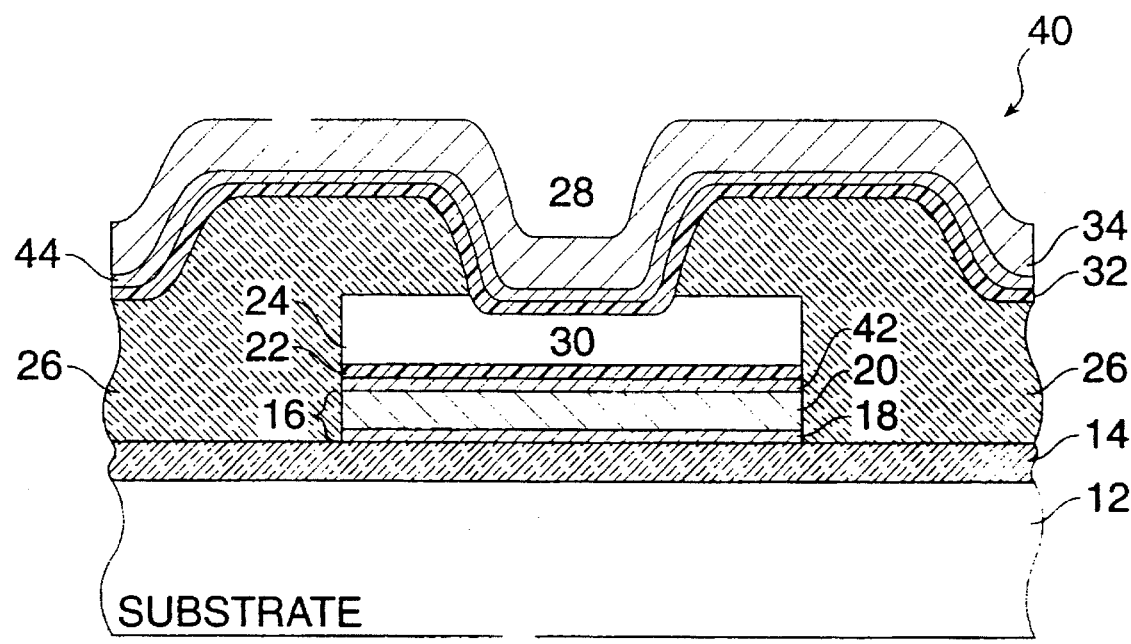
FIG. 3 is a cross-sectional view of the structure of an antifuse element according to an alternate embodiment of the invention incorporating a Ti reliability enhancing layer.

Referring now to FIG. 3, a cross-sectional view is shown of an alternate embodiment of the invention employing Ti reliability enhancing layers. According to this embodiment of the invention, a layer of Ti may be interposed between the layers comprising the composite interlayer and each of the electrodes. The Ti layer acts to enhance the reliability of the antifuse and prevent the phenomenon known as "switching" wherein a previously programmed antifuse reverts back to its unprogrammmed open state after time has elapsed.

When a metal-to-metal antifuse is programmed, a conductive link forms between the bottom electrode (metal) and the top electrode (metal). This link, in general, is an alloy consisting of the constituent elements of the bottom electrode, the antifuse material, and the top electrode. For example, if the bottom and top electrodes were formed from TiW and the antifuse material was amorphous silicon, the link is then an alloy of Ti, W, and Si. The thermal, electrical, and thermodynamic properties of the link depend on composition (percentages of the components) of the alloy.

A conductive link consisting of an alloy which is rich in Ti appears to result in an antifuse which is relatively immune from switching. Therefore, in antifuses which do nor employ Ti lower and upper electrodes, a "reliability enhancing layer" of Ti may be employed to provide a source of Ti atoms for the link in the vicinity of the antifuse material layer. This layer is best located between the lower and upper electrodes and the antifuse layer.

Antifuse 40 of FIG. 3 is substantially similar to antifuse 10 of FIG. 1 and the same reference numerals will be used to identify corresponding structures in both FIGS. 1 and 3. As will be appreciated by those of ordinary skill in the art, the materials used for the various layers of antifuse 40 may be the same materials used in the antifuse 10 of FIG. 1 and may have the same thicknesses.

Thus, antifuse 40 is shown fabricated on a semiconductor substrate 12. A layer 14, which those of ordinary skill in the art will recognize to comprise all the thin film layers above the substrate necessary for the fabrication of the integrated circuit, is disposed above substrate 12. The first, or lower, electrode 16 of the antifuse 40 is disposed on the upper surface of layer 14. Lower electrode 16 may comprise a portion of a metal interconnect layer used in the microcircuit containing the antifuses of the present invention.

Lower electrode 16 of the antifuse element 40 may comprise a composite layer including a first adhesion-promoting layer 18 covered by a metal layer 20. Those of ordinary skill in the art will recognize that adhesion-promoting layer 18 may not be necessary, depending on the particular materials used for metal layer 20. As presently preferred, the lower electrode 16 comprises a layer of Ti or TiN.

Unlike the antifuse of FIG. 1, where the first dielectric layer 22 is disposed over the surface of lower electrode 16, the antifuse of FIG. 3 employs a lower Ti reliability-enhancing layer 42 over the surface of lower electrode 16, which, in the embodiment of FIG. 3, comprises a material other than Ti. Ti reliability-enhancing layer 42 may be formed using conventional processing techniques, to a thickness preferably between about 50 to 4,000 angstroms, a thickness of about 1,000 angstroms being presently preferred. An antifuse layer 24 of doped or undoped silicon film, preferably produced by known CVD or sputtering techniques, is disposed over the first dielectric layer 22.

As shown in FIG. 3, the composite lower electrode 16, Ti reliability-enhancing layer 42, first dielectric layer 22 and antifuse layer 24 are preferably defined in a single etching step using conventional semiconductor processing techniques to provide both metal or other interconnects and lower electrodes for a plurality of antifuses according to the present invention.

An inter-layer dielectric layer 26 is disposed over the composite structure of layers 16, 42, 22, and 24, and an antifuse via 28 is formed therein. As in the antifuse 10 of FIG. 1, antifuse layer 24 is somewhat thinned in the region 30 of the antifuse via 28 (shown at reference numeral 30) due to the necessary over-etch which occurs during the formation of the antifuse via 28.

A second dielectric layer 32, similar to first dielectric layer 22, is disposed in antifuse via 28 on the surface of antifuse layer 24. First and second dielectric layers 22 and 32 may be but need not be made of the same material.

An upper Ti reliability enhancing layer 44 is disposed over the second dielectric layer 32. Upper Ti reliability-enhancing layer 44 may be formed using conventional processing techniques, to a thickness preferably between about 50 to 4,000 angstroms, a thickness of about 1,000 angstroms being presently preferred. Finally, second, or upper, electrode 34 is disposed in antifuse via 28 over second dielectric layer 32. Like lower electrode 16, upper electrode 34 may be a composite of an adhesion-promoting layer and a metal layer as used for the lower electrode 16.

Referring now to FIGS. 4a–4e, cross sectional views depicting the formation of the antifuse structure of FIG. 3 are presented, showing the structure resulting after selected ones of the processing steps used to fabricate the antifuse of the present invention. The details of the steps used to form the layers in antifuse 40 which correspond to layers in antifuse 10 of FIG. 1 are disclosed in the text describing FIGS. 2a–2e and will not be repeated here.

Figure 4A:
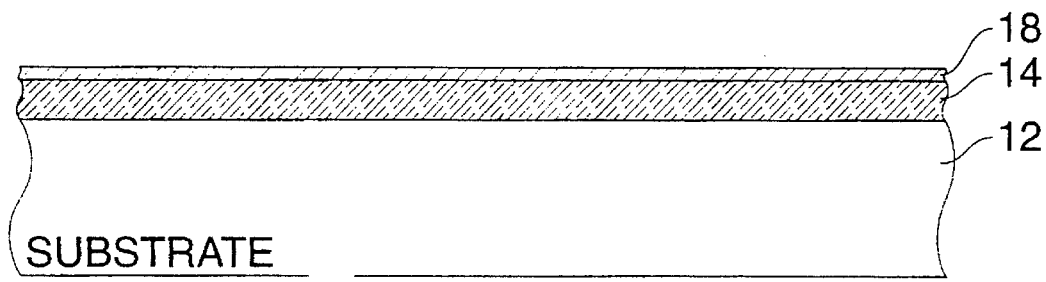
FIGS. 4a–4e are cross-sectional views of the antifuse element of FIG. 3, shown after completion of selected processing steps used to form the antifuse structure.

Referring now to FIG. 4a, substrate 12 covered by layer 14 is shown after formation of adhesion promoting layer 18. FIG. 4a shows the structure resulting after the formation of the adhesion-promoting layer 18.

Figure 4B:
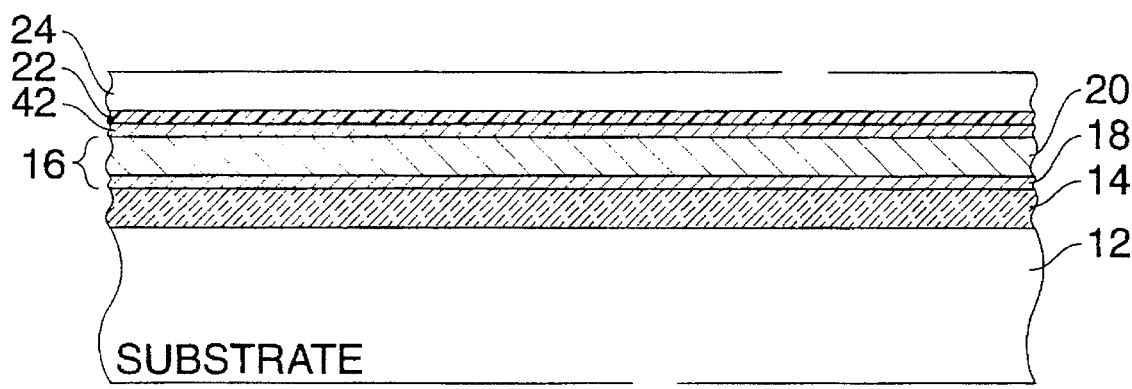

Referring now to FIG. 4b, the metal layer 20, which, together with adhesion-promoting layer 18 if needed, comprises lower electrode 16, has been formed using conventional metal processing technology. Lower Ti reliability-enhancing layer 42 is next formed over the surface of metal layer 20, to a thickness of between about 50 to 4,000 angstroms, preferably 1,000 angstroms using sputtering techniques. If metal layer 20 is formed from a material, such as aluminum, which interdiffuses with the Ti layer 42, a barrier layer such as TiN would be deposited between metal and Ti reliability-enhancing layers 20 and 42. A typical thickness for such a barrier layer would be about 2,000 angstroms, although such a layer could have thicknesses in the range of from about 500 angstroms to about 5,000 angstroms.

First dielectric layer 22 is next formed to a thickness of between about 50 and about 300 angstroms, and antifuse layer 24 of doped or undoped silicon film is next formed over the first dielectric layer 22. FIG. 4b shows the structure resulting after the formation of antifuse layer 24.

Figure 4C:
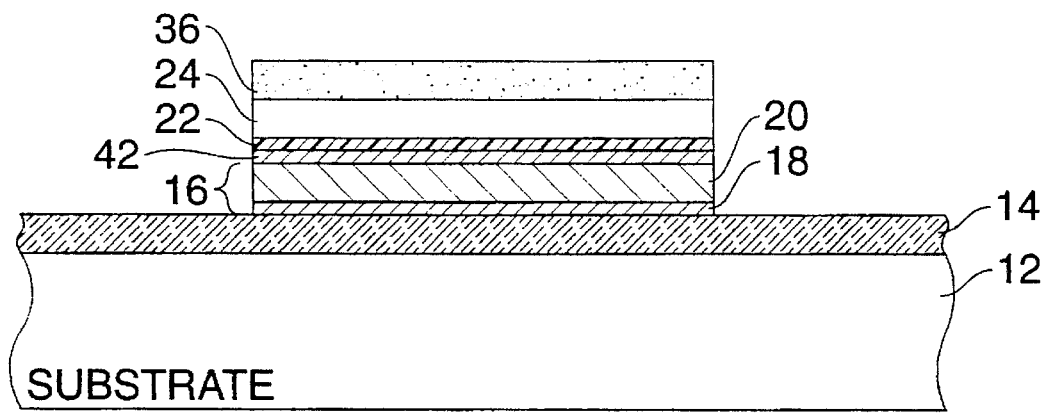

Referring now to FIG. 4c, a first photoresist layer 36 is placed over the composite structure of layers 18, 20, 42, 22, and 24 and is exposed and developed using conventional photolithography techniques. The composite structure of layers 18, 20, 42, 22, and 24 is then etched to define the lower portion of the antifuse structure, preferably using a plasma etching technique with first photoresist layer 36 as a mask. FIG. 4c shows the structure resulting from the etching step used to define the composite structure of layers 18, 20, 42, 22, and 24 prior to removal of first photoresist layer 36.

Figure 4D:
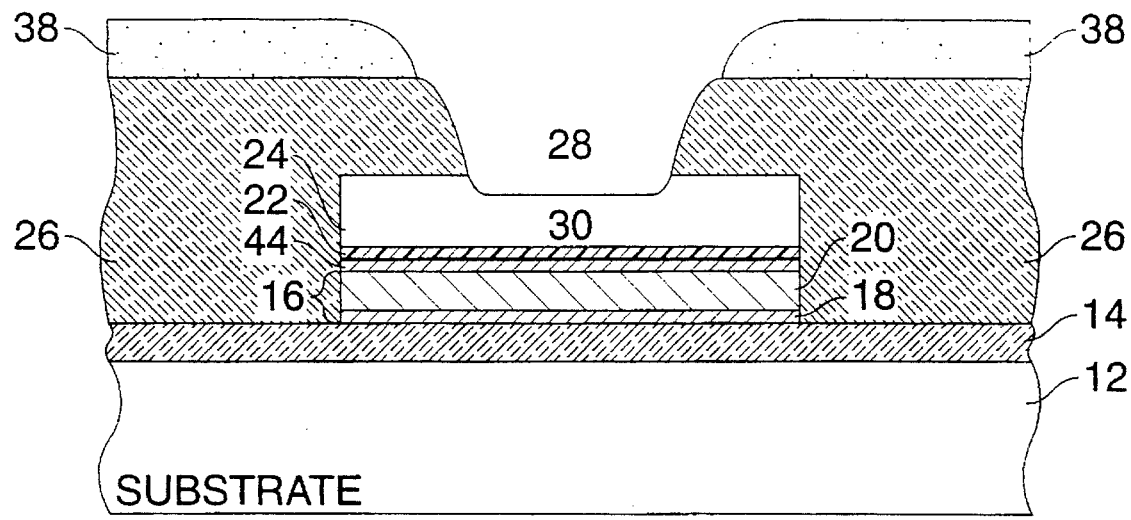

Referring now to FIG. 4d, the first photoresist layer 36 is removed using conventional techniques, and an inter-layer dielectric layer 26 is formed over the composite structure of layers 18, 20, 42, 22, and 24. Inter-layer dielectric 26 is typically formed from PECVD silicon dioxide. A second photoresist layer 38 to define the antifuse via 28 is placed over the surface of inter-layer dielectric layer 26 and is exposed and developed using conventional photolithography techniques. The inter-layer dielectric layer 26 is then etched using second photoresist layer 38 as a mask to define antifuse via 28. This etching step may be performed using a plasma etching technique to allow formation of a small geometry antifuse via 28. FIG. 4d shows the structure resulting from the antifuse via 28 etching step prior to removal of second photoresist layer 38. Those of ordinary skill in the art will notice the thinned region 30 of antifuse layer 24 at the bottom of antifuse via 28 as a result of the over-etch to assure complete formation of antifuse via 28. For an amorphous silicon antifuse layer 24 having a thickness of 300 to 1,000 angstroms and an inter-layer dielectric layer 26 having a thickness of 0.2 to 1.5 microns, the amount of thinning of antifuse layer 24 should be about 100 angstroms in a typical etch of a 0.6 micron sized antifuse via 28.

Figure 4E:
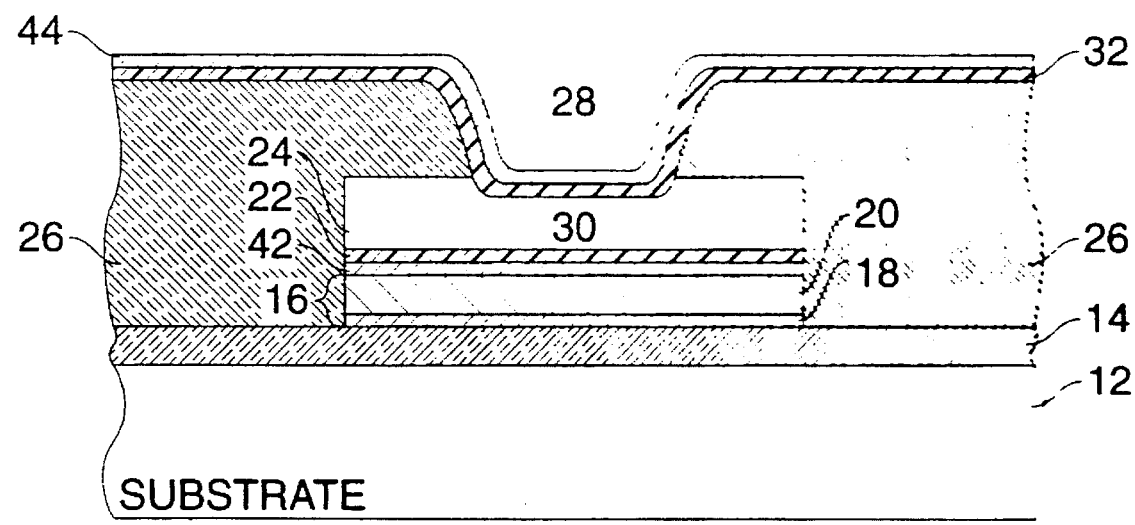

Referring now to FIG. 4e, second photoresist layer 38 is removed and a second dielectric layer 32 is formed. This layer is preferably, but need not be, formed from the same material as first dielectric layer 22 using the same materials processing techniques. From an examination of FIG. 4e, those of ordinary skill in the art will recognize that, as in the fabrication of antifuse 10 of FIG. 1, the "corner" of second dielectric layer 32 in antifuse 40 is disposed in the thinned region 30 of antifuse layer 24. As previously noted, this structure is advantageous because the antifuse conductive link or filament formed during programming of the antifuse 40 is far less likely to contain silicon dioxide material from the inter-layer dielectric layer 26.

Next, upper Ti reliability enhancing layer 44 is formed over the surface of second dielectric layer 32 to a thickness of between about 50 to 4,000 angstroms, preferably 1,000 angstroms using sputtering techniques. FIG. 4e shows the structure resulting after formation of upper Ti reliability-enhancing layer 44. The upper electrode will be formed next to complete the structure shown in FIG. 3. As with lower Ti reliability-enhancing layer 42, a barrier layer may be employed if the upper electrode is formed from a material which interdiffuses with Ti.

The antifuses of the present invention may be programmed by applying a voltage between the first and second electrodes. The magnitude of the programming voltage necessary to program the antifuse of the present invention depends on several factors including the thicknesses of layers 22, 24, and 32, the hydrogen content of these layers, as well as Si to N ratios of first and second dielectric layers 22 and 32. For example, an antifuse having 150 angstroms of PECVD silicon nitride for first and second dielectric layers 22 and 32 and 2,000 angstroms of amorphous silicon for antifuse layer 24, all deposited at 380° C., will need about 12 volts to program it.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An electrically programmable antifuse element disposed on a semiconductor substrate in an integrated circuit comprising:

an insulating layer covering active circuit elements on said integrated circuit;

a first metal electrode;

a first antifuse material layer formed of a dielectric film disposed on said first electrode;

a second antifuse material layer disposed on said first antifuse material layer;

an inter-layer dielectric layer disposed on said second antifuse material layer, said inter-layer dielectric layer including an antifuse via disposed therein and extending completely therethrough;

a third antifuse material layer formed of a formed of a dielectric film disposed on said second antifuse material layer in said antifuse via; and a second metal electrode disposed on said third antifuse material layer.

2. An electrically programmable antifuse element disposed on a semiconductor substrate in an integrated circuit comprising:

an insulating layer covering active circuit elements on said integrated circuit;

a first metal electrode;

a first antifuse material layer formed of a generic silicon nitride of the formula $Si_xN_y$:H disposed on said first electrode;

a second antifuse material layer disposed on said first antifuse material layer;

an inter-layer dielectric layer disposed on said second antifuse material layer, said inter-layer dielectric layer including an antifuse via disposed therein and extending completely therethrough;

a third antifuse material layer formed of a generic silicon nitride of the formula $Si_xN_y$:H disposed on said second antifuse material layer in said antifuse via; and a second metal electrode disposed on said third antifuse material layer.

3. The electrically programmable antifuse element of claim 2 wherein said first and third antifuse material layers have a thickness in the range of from 25 to about 300 angstroms.

4. The electrically programmable antifuse element of claim 2 wherein the hydrogen content of said first and third antifuse material layers is between about 5% and about 40%.

5. The electrically programmable antifuse element of claim 2 wherein the hydrogen content of said first and third antifuse material layers is about 10%.

6. The electrically programmable antifuse element of claim 2 wherein x=3 and y=4.

7. The electrically programmable antifuse element of claim 2 wherein x is a real number between 1 and 3, and y is a real number between 0 and 4.

8. An electrically programmable antifuse element disposed on a semiconductor substrate in an integrated circuit comprising:

an insulating layer covering active circuit elements on said integrated circuit;

a first metal electrode;

a first antifuse material layer formed of a silicon nitride of the formula $Si_3N_4$ disposed on said first electrode;

a second antifuse material layer disposed on said first antifuse material layer;

an inter-layer dielectric layer disposed on said second antifuse material layer, said inter-layer dielectric layer including an antifuse via disposed therein and extending completely therethrough;

a third antifuse material layer formed of a silicon nitride of the formula $Si_3N_4$ disposed on said second antifuse material layer in said antifuse via; and a second metal electrode disposed on said third antifuse material layer.

9. An electrically programmable antifuse element disposed on a semiconductor substrate in an integrated circuit comprising:

an insulating layer covering active circuit elements on said integrated circuit;

a first metal electrode;

a first antifuse material layer formed of a generic silicon nitride of the formula $Si_xN_y$:F disposed on said first electrode;

a second antifuse material layer disposed on said first antifuse material layer;

an inter-layer dielectric layer disposed on said second antifuse material layer, said inter-layer dielectric layer including an antifuse via disposed therein and extending completely therethrough;

a antifuse material layer formed of generic silicon nitride of the formula $Si_xN_y$:F disposed on said second antifuse material layer in said antifuse via; and a second metal electrode disposed on said third antifuse material layer.

10. An electrically programmable antifuse element disposed on a semiconductor substrate in an integrated circuit comprising:

an insulating layer covering active circuit elements on said integrated circuit;

a first metal electrode;

a first titanium layer disposed on said first metal electrode;

first antifuse material layer formed of a dielectric film disposed on said first electrode;

a second antifuse material layer disposed on said first antifuse material layer;

an inter-layer dielectric layer disposed on said second antifuse material layer, said inter-layer dielectric layer including an antifuse via disposed therein and extending completely therethrough;

third antifuse material layer formed of dielectric film disposed on said second antifuse material layer in said antifuse via;

second titanium layer disposed on said third antifuse material layer; and a second metal electrode disposed on said second titanium layer.

11. An electrically programmable antifuse element disposed on a semiconductor substrate in an integrated circuit comprising:

an insulating layer covering active circuit elements on said integrated circuit;

a first metal electrode;

a first titanium layer disposed on said first metal electrode;

a first antifuse material layer formed of a generic silicon nitride of the formula $Si_xN_y{:}H$ disposed on said first electrode;

a second antifuse material layer disposed on said first antifuse material layer;

an inter-layer dielectric layer disposed on said second antifuse material layer, said inter-layer dielectric layer including an antifuse via disposed therein and extending completely therethrough;

a third antifuse material layer formed of a generic silicon nitride of the formula $Si_xN_y{:}H$ disposed on said second antifuse material layer in said antifuse via;

second titanium layer disposed on said third antifuse material layer; and a second metal electrode disposed on said second titanium layer.

12. The electrically programmable antifuse element of claim 11 wherein said first and third antifuse material layers have a thickness in the range of from about 25 to about 300 angstroms.

13. The electrically programmable antifuse element of claim 11 wherein the hydrogen content of said first and third antifuse material layers is between about 5% and about 40%.

14. The electrically programmable antifuse element of claim 11 wherein the hydrogen content of said first and third antifuse material layers is about 10%.

15. The electrically programmable antifuse element of claim 11 wherein x=3 and y=4.

16. The electrically programmable antifuse element of claim 11 wherein x is a real number between 1 and 3, and y is an real number between 0 and 4.

17. An electrically programmable antifuse element disposed on a semiconductor substrate in an integrated circuit comprising:

an insulating layer covering active circuit elements on said integrated circuit;

a first metal electrode;

a first titanium layer disposed on said first metal electrode;

a first antifuse material layer formed of a silicon nitride of the formula $Si_3N_4$ disposed on said first electrode;

a second antifuse material layer disposed on said first antifuse material layer;

an inter-layer dielectric layer disposed on said second antifuse material layer, said inter-layer dielectric layer including an antifuse via disposed therein and extending completely therethrough;

a third antifuse material layer formed of a silicon nitride of the formula $Si_3N_4$ disposed on said second antifuse material layer in said antifuse via;

a second titanium layer disposed on said third antifuse material layer; and a second metal electrode disposed on said second titanium layer.

18. An electrically programmable antifuse element disposed on a semiconductor substrate in an integrated circuit comprising:

an insulating layer covering active circuit elements on said integrated circuit;

a first metal electrode;

a first titanium layer disposed on said first metal electrode;

a first antifuse material layer formed of a generic silicon nitride of the formula $Si_xN_y{:}F$ disposed on said first electrode;

a second antifuse material layer disposed on said first antifuse material layer;

an inter-layer dielectric layer disposed on said second antifuse material layer, said inter-layer dielectric layer including an antifuse via disposed therein and extending completely therethrough;

a third antifuse material layer formed of a generic silicon nitride of the formula $Si_xN_y{:}F$ disposed on said second antifuse material layer in said antifuse via;

a second titanium layer disposed on third antifuse material layer; and a second metal electrode disposed on said second titanium layer.

* * * * *

UNITED STATES PATENT AND TRADEMARK OFFICE
CERTIFICATE OF CORRECTION

| | |
|---|---|
| PATENT NO. : | 5,552,627 |
| DATED : | September 3, 1996 |
| INVENTOR(S) : | John L. McCollum; Abdelshafy Eltoukhy; Abdul R. Forouhi |

It is certified that error appears in the above-indentified patent and that said Letters Patent is hereby corrected as shown below:

On Column 6, line 4, replace "adhesion-promating" with --adhesion-promoting"--.

On Column 6, line 24, replace "adhesion promoting" with --adhesion-promoting--.

On Column 6, line 28, replace "adhesion promoting" with --adhesion-promoting--.

On Column 6, line 30, replace "c f" with --of--..

On Column 6, line 40, replace "range of from between about" with --range from about--.

On Column 6, line 47, replace "adhesion promoting" with --adhesion-promoting--.

On Column 8, line 3, replace "amd" with --and--.

On Column 9, line 36, delete "antifuse".

On Column 9, line 44, delete "material".

On Column 10, line 30, replace "nor" with --not--.

On Column 11, line 24, replace "reliability enhancing" with --reliability-enhancing--.

UNITED STATES PATENT AND TRADEMARK OFFICE
CERTIFICATE OF CORRECTION

PATENT NO. : 5,552,627
DATED : September 3, 1996
INVENTOR(S) : John L. McCollum; Abdelshafy Eltoukhy; Abdul R. Forouhi It is certified that error appears in the above-indentified patent and that said Letters Patent is hereby corrected as shown below:

On Column 11, line 28, replace "second," with --second--.

On Column 11, line 29, replace "upper," with --upper--.

On Column 11, line 54, after "Ti" insert --reliability-enhancing layer--.

On Column 12, line 45, replace "reliability enhancing" with --reliability-enhancing--.

On Column 13, line 21, delete the second occurence of "formed of a".

Signed and Sealed this

Thirty-first Day of December, 1996

Attest:

BRUCE LEHMAN

*Attesting Officer*  *Commissioner of Patents and Trademarks*